US012590362B2

(12) United States Patent    (10) Patent No.:   US 12,590,362 B2

Yamaguchi et al.    (45) Date of Patent:   Mar. 31, 2026

(54) DEPOSITION METHOD AND DEPOSITION APPARATUS

(71) Applicant: Tokyo Electron Limited, Tokyo (JP)

(72) Inventors: Katsumasa Yamaguchi, Yamanashi (JP); Tsubasa Yokoi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 829 days.

(21) Appl. No.: 17/664,941

(22) Filed: May 25, 2022

(65)       Prior Publication Data

US 2022/0389567 A1    Dec. 8, 2022

(30)     Foreign Application Priority Data

Jun. 4, 2021    (JP) ................................. 2021-094461

(51) Int. Cl.
| | |
|---|---|
| *C23C 16/02* | (2006.01) |
| *C23C 16/06* | (2006.01) |
| *C23C 16/52* | (2006.01) |
| *H01L 21/285* | (2006.01) |

(52) U.S. Cl.
CPC .......... *C23C 16/0272* (2013.01); *C23C 16/06* (2013.01); *C23C 16/52* (2013.01); *H01L 21/28568* (2013.01)

(58) Field of Classification Search
None
See application file for complete search history.

(56)        References Cited

U.S. PATENT DOCUMENTS

2019/0067094 A1*   2/2019   Zope ................. H01L 21/28568
2019/0271071 A1    9/2019   Wu et al.

FOREIGN PATENT DOCUMENTS

| | | |
|---|---|---|
| JP | 2003-193233 | 7/2003 |
| JP | 2020-029618 | 2/2020 |
| JP | 2020-176332 | 10/2020 |
| WO | 2019/209289 | 10/2019 |

* cited by examiner

*Primary Examiner* — Alexander M Weddle
(74) *Attorney, Agent, or Firm* — IPUSA, PLLC

(57)        ABSTRACT

A film deposition method includes preparing a substrate having an insulating film formed thereon, forming a seed layer on the insulating film, and supplying a molybdenum-containing gas and a reducing gas to the substrate having the seed layer famed thereon, to foam a molybdenum film on the seed layer.

11 Claims, 8 Drawing Sheets

100

101

100

102

101

100

103

102

101

DEPOSITION METHOD AND DEPOSITION APPARATUS

CROSS-REFERENCE TO RELATED APPLICATIONS

This application is based upon and claims priority to Japanese Patent Application No. 2021-094461, filed on Jun. 4, 2021, the entire contents of which are incorporated herein by reference.

BACKGROUND

1. Field of the Invention

The present disclosure relates to deposition methods and deposition apparatuses.

2. Description of the Related Art

A metal or metal compound is deposited to form a thin film, in order to form an interconnect pattern on a surface of a semiconductor wafer, or to fill a recess between interconnects or the like, or to fill a recess for contact. For example, Japanese Laid-Open Patent Publication No. 2003-193233 proposes a technique for forming a tungsten film in a through hole via formed at the surface of the semiconductor wafer, by alternately supplying a tungsten-containing gas and a reducing gas to the semiconductor wafer.

SUMMARY

One aspect of embodiments of the present disclosure provides a technique for forming a molybdenum film on an underlayer, while reducing damage to the underlayer.

A deposition method according to one aspect of the embodiments of the present disclosure includes preparing a substrate having an insulating film famed thereon; forming a seed layer on the insulating film; and supplying a molybdenum-containing gas and a reducing gas to the substrate having the seed layer formed thereon, to form a molybdenum film on the seed layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
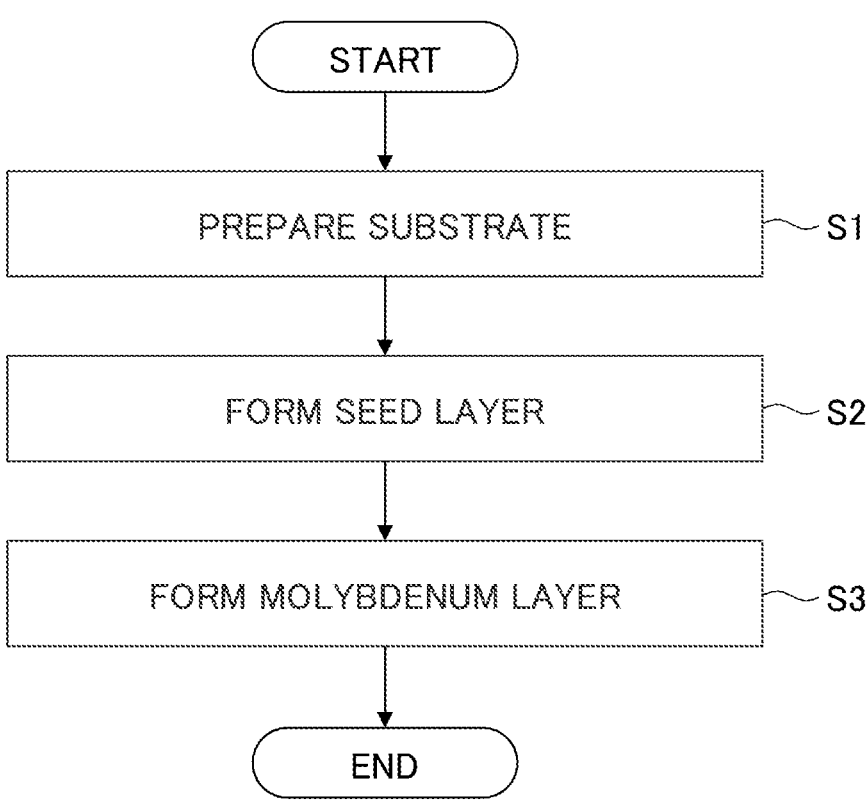
FIG. 1 is a flow chart illustrating an example of a deposition method according to one embodiment.

Hereinafter, non-limiting embodiments of the present disclosure will be described with reference to the accompanying drawings. In all the accompanying drawings, the same or corresponding members or parts are designated by the same or corresponding reference numerals, and a repeated description of the same or corresponding members or parts will be omitted.

[Molybdenum (Mo) Film]

Because a molybdenum film is a low-resistance film and can be formed using a fluorine-free gas, much attention is drawn to applying the molybdenum film to a gate electrode, a source electrode, and a drain electrode of a metal oxide semiconductor field effect transistor (MOSFET), a word line of a memory, or the like, for example.

The molybdenum film is formed by atomic layer deposition (ALD) or chemical vapor deposition (CVD), for example. When forming the molybdenum film on an underlayer, such as a block oxide film of a NAND memory, for example, by the ALD method or the CVD method, a molybdenum-containing gas, such as a molybdenum dioxide molybdenum ($MoO_2Cl_2$) gas or the like, and a reducing gas, such as a hydrogen ($H_2$) gas or the like, are supplied to the underlayer. In this state, because a surface of the underlayer is exposed during the film deposition process, the surface of the underlayer is exposed to the reducing gas. For this reason, oxygen included in the underlayer may be extracted by the reducing gas, to thereby deteriorate characteristics of the underlayer.

Accordingly, the present disclosure provides a technique for forming a molybdenum film on an underlayer, while reducing damage to the underlayer.

[Deposition Method]

Figure 2A:
FIG. 2A, FIG. 2B, and FIG. 2C are cross sectional views illustrating an example of processes of the deposition method according to one embodiment.
Figure 2B:
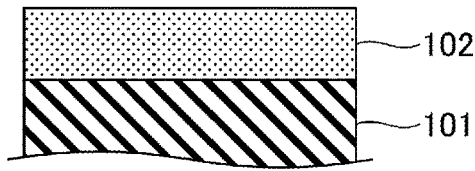
Figure 2C:
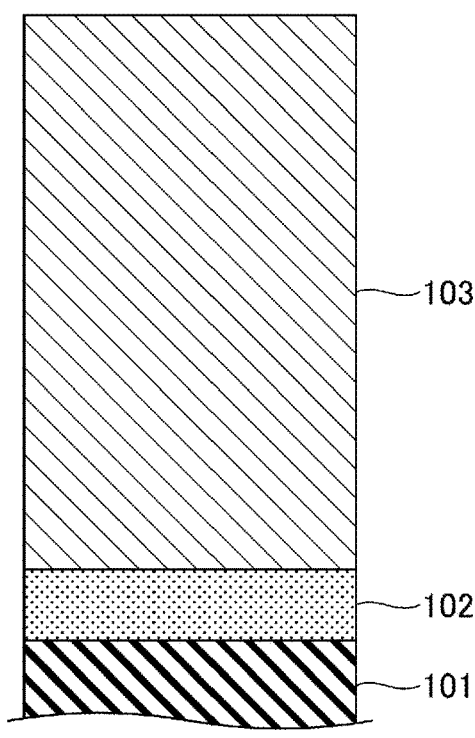

An example of a deposition method according to one embodiment will be described, by referring to FIG. 1 through FIG. 5. FIG. 1 is a flowchart illustrating an example of the deposition method according to one embodiment. FIG. 2A through FIG. 2C are cross sectional views illustrating an example of processes of the deposition method according to one embodiment.

As illustrated in FIG. 1, the deposition method according to one embodiment forms a molybdenum film on a substrate by performing step S1 of preparing the substrate, step S2 of forming a seed layer, and step S3 of forming a molybdenum film, in this order. The molybdenum film can be utilized as a word line of a NAND memory, for example.

The step (or process) S1 of preparing the substrate includes preparing a substrate 100 having an insulating film 101 formed thereon, as illustrated in FIG. 2A. The substrate 100 is a semiconductor wafer, such as a silicon wafer or the like. The insulating film 101 may be a block oxide film of the NAND memory, for example, and is formed of a metal oxide, such as aluminum oxide (AlO) or the like, for example.

The step (or process) S2 of forming the seed layer includes forming a seed layer 102 on the insulating film 101, as illustrated in FIG. 2B. The seed layer 102 is famed by exposing the substrate 100 to at least one gas selected from a silicon-containing gas, a boron-containing gas, and an oxygen-containing gas, in a state where a substrate temperature is adjusted to a predetermined temperature, for example.

Examples of the silicon-containing gas include a silicon hydride gas, a halogen-containing silicon gas, and an aminosilane-based gas, for example. Examples of the silicon hydride gas include a $SiH_4$ gas, a $Si_2H_6$ gas, a $Si_3H_8$ gas, a $Si_4H_{10}$ gas, and a $SiD_4$ gas, for example. Examples of the halogen-containing gas include a fluorine-containing silicon gas, a chlorine-containing silicon gas, a bromine-containing silicon gas, and an iodine-containing silicon gas, for example. Examples of the fluorine-containing silicon gas include a $SiF_4$ gas, a $SiHF_3$ gas, a $SiH_2F_2$ gas, and a $SiH_3F$ gas, for example. Examples of the chlorine-containing silicon gas include a $SiCl_4$ gas, a $SiHCl_3$ gas, a $SiH_2Cl_2$ gas, a $SiH_3Cl$ gas, and a $Si_2Cl_6$ gas, for example. Examples of the bromine-containing silicon gases include a $SiBr_4$ gas, a $SiHBr_3$ gas, a $SiH_2Br_2$ gas, and a $SiH_3Br$ gas, for example. Examples of the iodine-containing silicon gas include a $SiI_4$ gas, a $SiHI_3$ gas, a $SiH_2I_2$ gas, and a $SiH_3I$ gas, for example. Examples of the aminosilane-based gas include a di-isopropylamino silane (DIPAS) gas, a tris-dimethylamino silane (3DMAS or TDMAS) gas, a bis tert-butylamino silane (BTBAS), and a 2-dimethylamino-2,4,6,8-tetramethyl cyclotetrasiloxane gas, for example. Examples of the boron-containing gas include a $B_2H_6$ gas, and a $BCl_3$ gas, for example. Examples of the oxygen-containing gas include a $O_2$ gas, a $O_3$ gas, and a $H_2O$ gas, for example.

The step (or process) S3 of foaming the molybdenum film includes forming a molybdenum film 103 on the seed layer 102, as illustrated in FIG. 2C. The molybdenum film 103 is formed on the seed layer 102 using ALD or the CVD, for example, by supplying a molybdenum-containing gas and a reducing gas to the substrate 100 in a state where the substrate temperature is adjusted to a predetermined temperature. The molybdenum-containing gas is a $MoO_2Cl_2$ gas, for example. The reducing gas is a $H_2$ gas, for example. As described above, because the step S3 of foaming the molybdenum film is performed after the seed layer 102 is famed on the insulating film 101, it is possible to shorten a time delay from a time when the supply of the molybdenum-containing gas is started until a time when the deposition of the molybdenum film is started (hereinafter also referred to as an "incubation time"). Accordingly, it is possible to shorten a time during which the surface of the insulating film 101 is exposed to the reducing gas. For this reason, it is possible to reduce extraction of oxygen from inside the insulating film 101, caused by the reducing gas. As a result, it is possible to reduce a deterioration of the characteristics of the insulating film 101, caused by the extraction of oxygen from inside the insulating film 101.

As described above, in the deposition method according to one embodiment, the seed layer 102 is formed on the insulating film 101, before forming the molybdenum film 103 on the seed layer 102 by supplying the molybdenum-containing gas and the reducing gas to the substrate 100. Hence, it is possible to reduce the incubation time, and reduce the time during which the surface of the insulating film 101 is exposed to the reducing gas. For this reason, it is possible to reduce the extraction of oxygen from inside the insulating film 101, caused by the reducing gas. As a result, it is possible to reduce the deterioration of the characteristics of the insulating film 101 caused by the extraction of oxygen from inside the insulating film 101.

In the deposition method according to one embodiment, the molybdenum film 103 is formed by the ALD or CVD, using the $MoO_2Cl_2$ gas and the $H_2$ gas. That is, a fluorine-free gas is used to form the molybdenum film 103. For this reason, it is possible to reduce damage caused by fluorine to a film (for example, a $SiO_2$ film) that is exposed when foaming the molybdenum film 103.

[Mechanism]

Figure 3:
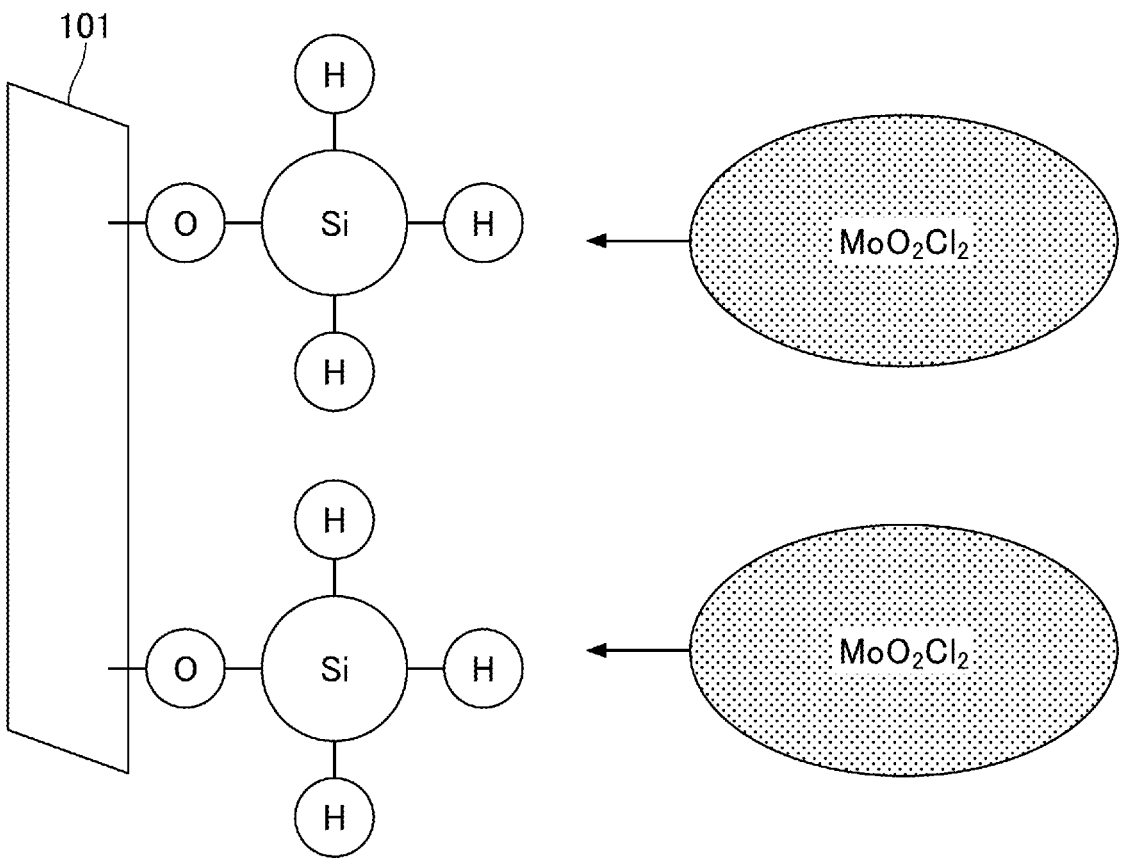
FIG. 3 is a diagram for explaining a reaction model for a case where a seed layer is formed using a silicon-containing gas.

A mechanism by which the incubation time is shortened when the substrate 100 having the insulating film 101 formed thereon is exposed to the silicon-containing gas, and the seed layer 102 is formed on the insulating film 101 before forming the molybdenum film 103, by referring to FIG. 3. Hereinafter, an example will be described in which the $SiH_4$ gas is used as the silicon-containing gas, the $MoO_2Cl_2$ gas is used as the molybdenum-containing gas, and the $H_2$ gas is used as the reducing gas.

First, when the substrate 100 is exposed to the $SiH_4$ gas, the $SiH_4$ gas, which is the seed layer 102, is adsorbed on the surface of the insulating film 101.

Next, when the $MoO_2Cl_2$ gas and $H_2$ gas are supplied to the substrate 100, the molybdenum film 103 is formed on the insulating film 101 by reactions between the $MoO_2Cl_2$ gas and the $SiH_4$ gas adsorbed on the surface of the insulating film 101, and reactions between the $MoO_2Cl_2$ gas and the $H_2$ gas.

The reactions between the $SiH_4$ gas and the $MoO_2Cl_2$ gas include a reaction represented by the following formula (1).

$$MoO_2Cl_2[g]+SiH_4[g] \rightarrow Mo[s]+SiO_2+2HCl[g]+H_2[g] \quad (1)$$

In addition, the reactions between the $MoO_2Cl_2$ gas and the $H_2$ gas include a reaction represented by the following formula (2).

$$MoO_2Cl_2[g]+3H_2[g] \rightarrow Mo[s]+12H_2O[g]+2HCl[g] \quad (2)$$

Next, an extent of the reaction represented by the formula (1) and an extent of the reaction represented by the formula (2) will be studied, based on a variation AG of Gibbs energy. By checking the variation $\Delta G$ of the Gibbs energy, it is possible to determine an extent of spontaneous reaction. More particularly, when $\Delta G<0$, it can be determined that progress of the spontaneous reaction will occur, and that the larger an absolute value of the variation $\Delta G$ becomes, the more likely the spontaneous reaction will progress. In addition, when $\Delta G=0$, it can be determined that an equilibrium state is reached. Further, when $\Delta G>0$, it can be determined that the spontaneous reaction will not progress.

When a variation $\Delta G_1$ of the Gibbs energy for the reaction represented by the formula (1) and a variation $\Delta G_2$ of the Gibbs energy for the reaction represented by the formula (2) were computed through simulation, both the variations $\Delta G_1$ and $\Delta G_2$ had negative values (that is, $\Delta G_1<0$, and $\Delta G_2<0$). From these results, it may be determined that both the reaction represented by the formula (1) and the reaction represented by the formula (2) progress spontaneously.

In addition, the absolute value of the variation $\Delta G_1$ of the Gibbs energy for the reaction represented by the formula (1) had a value greater than the absolute value of the variation $\Delta G_2$ of the Gibbs energy for the reaction represented by the formula (2) (that is, $|\Delta G_1|>|\Delta G_2|$). From these results, it may be determined that the reaction represented by the formula (1) is more likely to progress than the reaction represented by the formula (2).

Based on the results described above, it may be regarded that the incubation time at the surface where the $SiH_4$ gas is adsorbed on the insulating film 101 is shortened compared to the surface where the $SiH_4$ gas is not adsorbed on the insulating film 101, and that the time during which the surface of the insulating film 101 is exposed to the reducing gas is shortened.

In addition, at the surface where the $SiH_4$ gas is adsorbed on the insulating film 101, $SiO_2$ is generated by the reaction between the $SiH_4$ gas and the $MoO_2Cl_2$ gas as represented by the formula (1), in an initial stage of forming the molybdenum film 103, and thus, the $SiO_2$ film is formed very slightly on the insulating film 101. For this reason, it may be regarded that an oxygen concentration at an interface between the insulating film 101 and the molybdenum film 103 increases, and reduces desorption of the oxygen from inside the insulating film 101.

Figure 4:
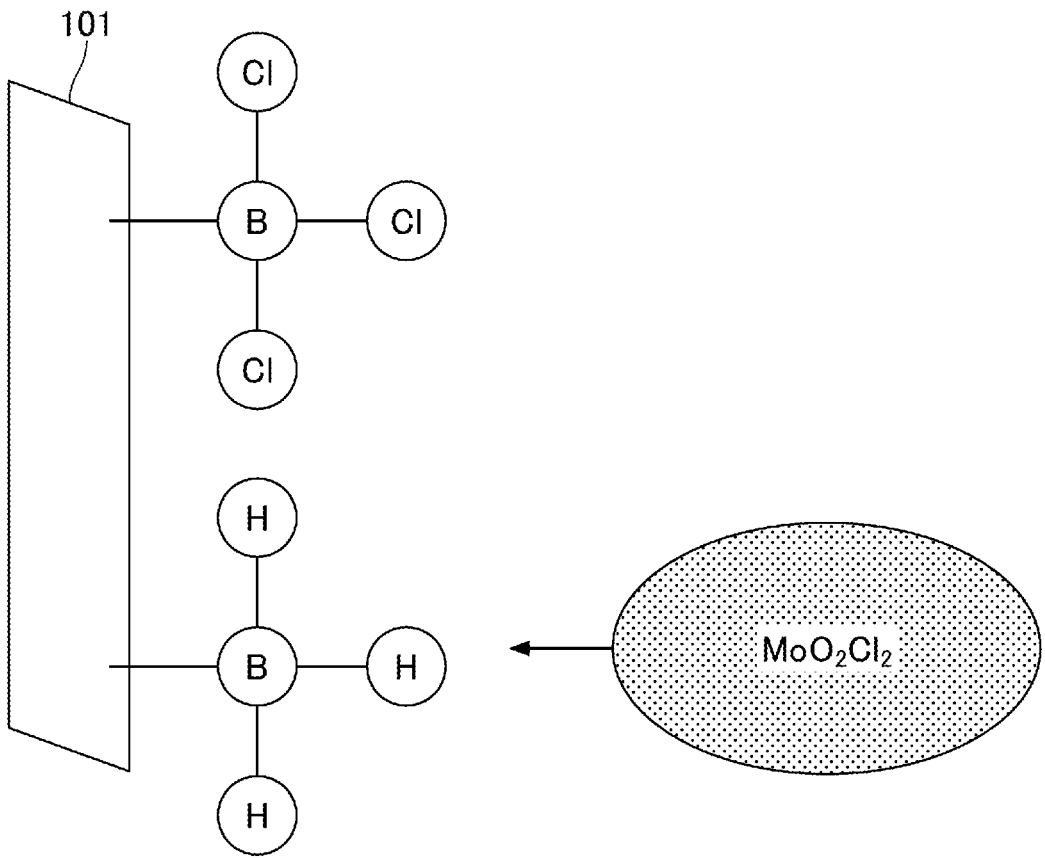
FIG. 4 is a diagram for explaining a reaction model for a case where the seed layer is formed using a boron-containing gas.

A mechanism by which the incubation time is reduced when the substrate 100 having the insulating film 101 formed thereon is exposed to the boron-containing gas to form the seed layer 102 on the insulating film 101, before forming the molybdenum film 103, will be described by referring to FIG. 4. In the example described hereinafter, the $BCl_3$ gas is used as the boron-containing gas, the $MoO_2Cl_2$ gas is used as the molybdenum-containing gas, and the $H_2$ gas is used as the reducing gas.

First, when the substrate 100 is exposed to the $BCl_3$ gas, the $BCl_3$ gas is adsorbed on the surface of the insulating film 101, and a BH-termination is formed.

Next, when the $MoO_2Cl_2$ gas and $H_2$ gas are supplied to the substrate 100, the molybdenum film 103 is formed on the insulating film 101 by reactions between the BH-termination formed on the surface of the insulating film 101 and the $MoO_2Cl_2$ gas, and reactions between the $MoO_2Cl_2$ gas and the $H_2$ gas.

The reactions between the BH-termination ($B_2H_6$ gas) and the $MoO_2Cl_2$ gas include a reaction represented by the following formula (3).

$$MoO_2Cl_2[g]+B_2H_6[g] \rightarrow MoB_2+2HCl[g]+2H_2O[g] \qquad (3)$$

The reactions between the $MoO_2Cl_2$ gas and the $H_2$ gas include a reaction represented by the following formula (4).

$$MoO_2Cl_2[g]+3H_2[g] \rightarrow Mo[s]+2H_2O[g]+2HCl[g] \qquad (4)$$

Next, an extent of the reaction represented by the formula (3) and an extent of the reaction represented by the formula (4) will be studied, based on the variation $\Delta G$ of Gibbs energy.

When a variation $\Delta G_3$ of the Gibbs energy for the reaction represented by the formula (3) and a variation $\Delta G_4$ of the Gibbs energy for the reaction represented by the formula (4) were computed through simulation, both the variations $\Delta G_3$ and $\Delta G_4$ had negative values (that is, $\Delta G_3 < 0$, and $\Delta G_4 < 0$). From these results, it may be determined that both the reaction represented by the formula (3) and the reaction represented by the formula (4) progress spontaneously.

In addition, the absolute value of the variation $\Delta G_3$ of the Gibbs energy for the reaction represented by the formula (3) had a value greater than the absolute value of the variation $\Delta G_4$ of the Gibbs energy for the reaction represented by the formula (4) (that is, $|\Delta G_3| > |\Delta G_4|$). From these results, it may be determined that the reaction represented by the formula (3) is more likely to progress than the reaction represented by the formula (4).

Based on the results described above, it may be regarded that the incubation time at the surface where the BH-termination is formed on the insulating film 101 is shortened compared to the surface where the BH-termination is not formed on the insulating film 101, and that the time during which the surface of the insulating film 101 is exposed to the reducing gas is shortened.

Figure 5:
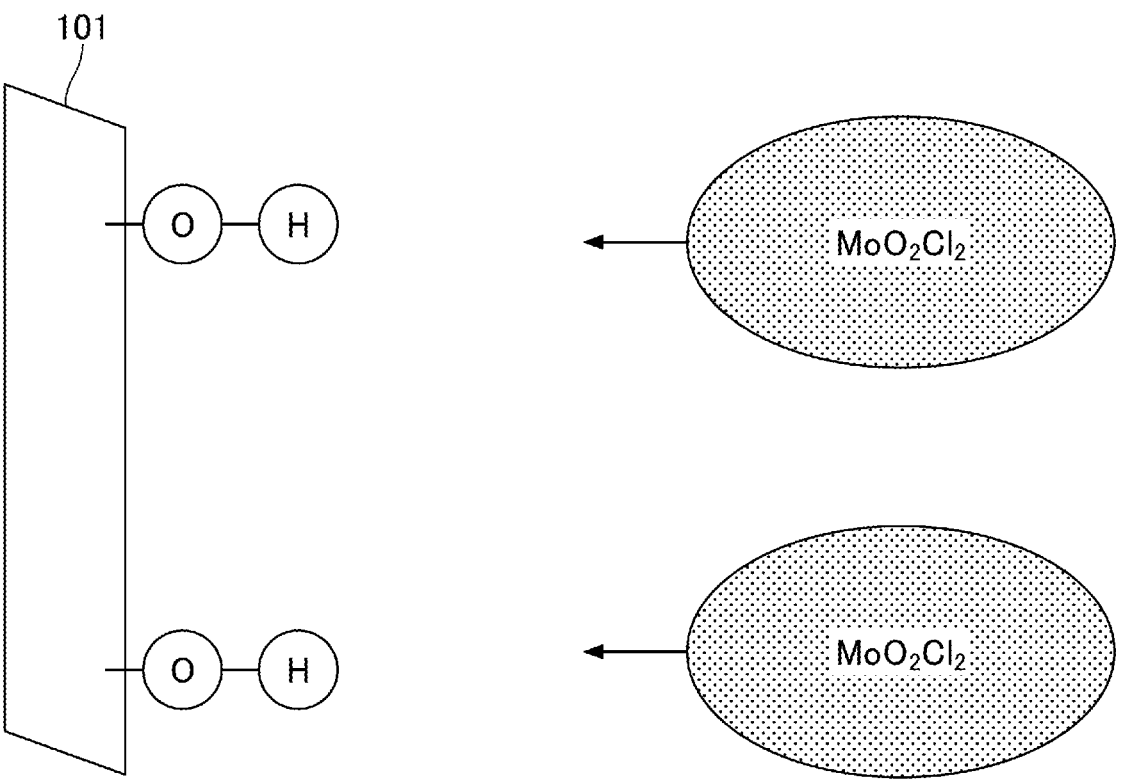
FIG. 5 is a diagram for explaining a reaction model for a case where the seed layer is formed using an oxygen gas.

Next, a mechanism by which the incubation time is reduced when the substrate 100 having the insulating film 101 formed thereon is exposed to the oxygen-containing gas to form the seed layer 102 on the insulating film 101, before forming the molybdenum film 103, will be described by referring to FIG. 5. In the example described hereinafter, the $H_2O$ gas is used as the oxygen-containing gas, the $MoO_2Cl_2$ gas is used as the molybdenum-containing gas, and the $H_2$ gas is used as the reducing gas.

First, when the substrate 100 is exposed to the $H_2O$ gas, the $H_2O$ gas is adsorbed on the surface of the insulating film 101, thereby resetting contamination on the surface of the insulating film 101, and generating an O-termination and an OH group on the surface of the insulating film 101.

Next, when the $MoO_2Cl_2$ gas and the $H_2$ gas are supplied to the substrate 100, the molybdenum film 103 is formed on the insulating film 101 by reactions between each of the O-termination and the OH group formed on the surface of the insulating film 101 and the $MoO_2Cl_2$ gas, and reactions between the $MoO_2Cl_2$ gas and the $H_2$ gas. In this state, the $MoO_2Cl_2$ gas is more likely to be adsorbed on the surface where the contamination is reset than on the surface where the contamination is not reset. As a result, it may be regarded that the incubation time is shortened, and that the time during which the surface of the insulating film 101 is exposed to the reducing gas is shortened.

[Deposition Apparatus]

Figure 6:
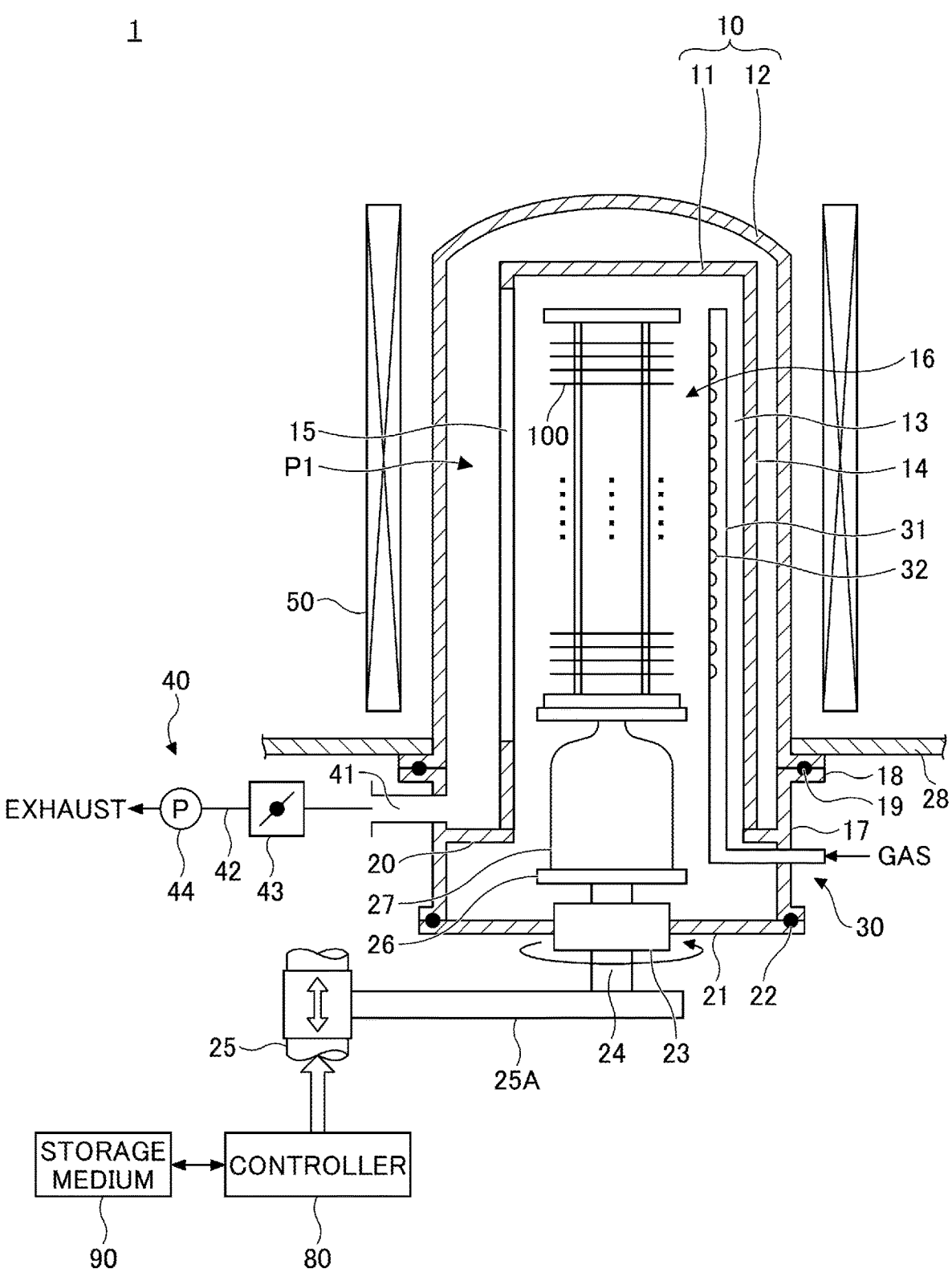
FIG. 6 is a diagram illustrating an example of a deposition apparatus for implementing the deposition method according to one embodiment.

An example of a deposition apparatus for implementing the deposition method according to one embodiment will be described, with reference to FIG. 6. As illustrated in FIG. 6, a deposition apparatus 1 is a batch-type apparatus that processes a plurality of substrates simultaneously.

The deposition apparatus 1 includes a processing chamber 10, a gas supply 30, an exhaust 40, a heater 50, a controller 80, or the like.

The processing chamber 10 is capable of depressurizing an interior thereof. The processing chamber 10 accommodates the substrate 100. The substrate 100 is a semiconductor wafer, for example. The processing chamber 10 includes an inner tube 11, an outer tube 12, or the like. The inner tube 11 has a cylindrical shape with a closed upper end (or ceiling), and an open lower end (or opening). The outer tube 12 has a cylindrical shape with a closed upper end (or ceiling), and an open lower end (or opening). The outer tube 12 covers an outer periphery of the inner tube 11. The inner tube 11 and the outer tube 12 are formed of a heat-resistant material, such as quartz or the like, and are arranged coaxially to form a double tube configuration.

The closed upper end of the inner tube 11 is flat, for example. An accommodating part 13 is famed on one side of the inner tube 11, along a longitudinal direction (vertical direction in FIG. 6) of the inner tube 11. The accommodating part 13 accommodates gas nozzles 31 along the longitudinal direction of the inner tube 11. The accommodating part 13 is a region inside a convex part 14 that is formed by causing a portion of a sidewall of the inner tube 11 to project outward.

A rectangular opening 15 is formed in the sidewall of the inner tube 11, on an opposite side from the accommodating part 13. The opening 15 extends along the longitudinal direction of the inner tube 11.

The opening 15 is a gas exhaust port configured to evacuate the gas inside the inner tube 11. A length of the opening 15 may be the same as a length of a boat 16, or may be longer than the length of the boat 16 so as to extend above and below the boat 16 in the vertical direction.

A lower end of the processing chamber 10 is supported by a cylindrical manifold 17 formed of stainless steel, for example. A flange 18 is formed on an upper end of the manifold 17, and is configured to support the lower end of the outer tube 12 that is disposed on the flange 18. A sealing member 19, such as an O-ring or the like, is interposed between the flange 18 and the lower end of the outer tube 12, to establish an airtight state inside the outer tube 12.

An annular support 20 is provided on an inner wall at an upper portion of the manifold 17, and is configured to support a lower end of the inner tube 11 that is disposed on the support 20. A lid 21 is attached in an airtight state to an opening at a lower end of the manifold 17 through a seal member 22, such as an O-ring or the like, to close an opening at a lower end of the processing chamber 10, that is, the opening of the manifold 17, in the airtight state. The lid 21 is formed of stainless steel, for example.

A rotating shaft 24, that rotatably supports the boat 16, penetrates a center portion of the lid 21 through a magnetic fluid seal 23. A lower portion of the rotating shaft 24 is rotatably supported on an arm 25A of an elevating mechanism 25 formed by a boat elevator.

A rotating plate 26 is provided on an upper end of the rotating shaft 24, and the boat 16, that is configured to hold the substrate 100, is provided on the rotating plate 26 through an insulation base 27 made of quartz. Accordingly, by raising and lowering the elevating mechanism 25, the lid 21 and the boat 16 move up and down together, so that the boat 16 is inserted into and extracted from the processing chamber 10. The boat 16 can be accommodated inside the processing chamber 10, and holds a plurality of (for example, 50 to 150) substrates 100 that are spaced apart from each other in the vertical direction, in a state where each substrate 100 is held in an approximately horizontal state.

The gas supply 30 includes a gas nozzle 31. The gas nozzle 31 is made of quartz, for example. The gas nozzle 31 is provided inside the inner tube 11 along the longitudinal direction thereof, and is supported so that a base end of the nozzle 31 is bent in an L-shape and penetrates the manifold 17. The gas nozzle 31 has a plurality of gas holes 32 along a longitudinal direction thereof, and various process gases are discharged in the horizontal direction direction from the plurality of gas holes 32. The gas holes 32 are spaced apart from each other with the same spacing as the substrates 100 supported by boat 16, for example. The various process gases include gases used in the deposition process of the embodiments, such as molybdenum-containing gases, reducing gases, silicon-containing gases, boron-containing gases, oxygen-containing gases, or the like, for example.

In the example illustrated in FIG. 6, the gas supply 30 includes one gas nozzle 31, however, the number of gas nozzles is not particularly limited. For example, the gas supply 30 may include a plurality of gas nozzles. In this case, the various process gases may be discharged from the same gas nozzle or from different gas nozzles.

The exhaust 40 exhausts the gas that is discharged from the inside of the inner tube 11 through the opening 15, and discharged from a gas outlet 41 through a space P1 between the inner tube 11 and the outer tube 12. The gas outlet 41 is formed in an upper sidewall of the manifold 17, at a position above the support 20. An exhaust passage 42 is connected to the gas outlet 41. A pressure regulating valve 43 and a vacuum pump 44 are sequentially installed in the exhaust passage 42, so as to enable the inside of the processing chamber 10 to be evacuated.

The heater 50 is disposed around a periphery of the outer tube 12. The heater 50 is provided on a base plate 28, for example. The heater 50 has a cylindrical shape so as to cover the outer tube 12. The heater 50 includes a heating element, for example, and heats the substrates 100 inside the processing chamber 10.

The controller 80 is configured to control the operation of each part of the deposition apparatus 1. The controller 80 may be a computer, a processor, or the like, for example. A computer program for causing the computer to operate each part of the deposition apparatus 1 is stored in a storage medium 90. The storage medium 90 may be a flexible disk, a compact disk, a hard disk, a flash memory, a digital versatile disk (DVD), or the like, for example. The storage medium 90 may be a non-transitory computer-readable storage medium.

<Operation of Deposition Apparatus>

An example of the operation of the deposition apparatus 1 when performing the deposition method according to one embodiment will be described.

First, the controller 80 controls the elevating mechanism 25 to transport the boat 16, which holds the plurality of substrates 100 having the insulating film 101 formed thereon, into the processing chamber 10, and seal the opening at the lower end of the processing chamber 10 by the lid 21.

Next, the controller 80 controls the gas supply 30, the exhaust 40, the heater 50, or the like to perform the step S2 of foaming the seed layer. More particularly, the controller 80 first controls the exhaust 40 to depressurize the inside of the processing chamber 10 to a predetermined pressure, and controls the heater 50 to stabilize the substrate temperature to a predetermined temperature. Then, the controller 80 controls the gas supply 30 to supply at least one of a silicon-containing gas, a boron-containing gas, and an oxygen-containing gas into the processing chamber 10. As a result, the seed layer 102 is formed on the insulating film 101.

Next, the controller 80 controls the gas supply 30, the exhaust 40, the heater 50, or the like to perform step S3 of forming the molybdenum film. More particularly, the controller 80 first controls the exhaust 40 to depressurize the inside of the processing chamber 10 to a predetermined pressure, and controls the heater 50 to stabilize the substrate temperature to a predetermined temperature. Then, the controller 80 controls the gas supply 30 to repeat an operation of alternately supplying a molybdenum-containing and a reducing gas into the processing chamber 10. As a result, the molybdenum film 103 is formed on the seed layer 102. A purge gas may be supplied between the supplying of the molybdenum-containing gas and the supplying of the reducing gas.

Next, the controller 80 controls the elevating mechanism 25 to transport the boat 16 inside the processing chamber 10 to the outside of the processing chamber 10.

By the operation described above, the molybdenum film 103 can be formed on the insulating film 101 by performing the deposition method according to one embodiment in the deposition apparatus 1.

[Results of Experiments]

<Incubation Time>

Results of experiments in which a change in an incubation time is confirmed when the molybdenum film is formed by changing a type of the seed layer, will be described.

First, a substrate having an AlO film formed thereon as an insulating film, is prepared. Then, the prepared substrate is exposed to various types of process gases, to form a seed layer on the AlO film. The various types of process gases include a $SiH_4$ gas, a DIPAS gas, a $B_2H_6$ gas, a $BCl_3$ gas, and an $O_2$ gas. Next, a molybdenum film is famed on the seed layer, by repeating an ALD cycle that includes supplying a $MoO_2Cl_2$ gas, which is the molybdenum-containing gas, and supplying a $H_2$ gas, which is the reducing gas, to the substrate having the seed layer formed thereon.

In addition, for comparison purposes, a substrate having an AlO film formed thereon is prepared. Then, without forming a seed layer on the AlO film, a molybdenum film is formed on the AlO film by repeating an ALD cycle that includes supplying a $MoO_2Cl_2$ gas, and supplying a $H_2$ gas, to the prepared substrate.

Figure 7:
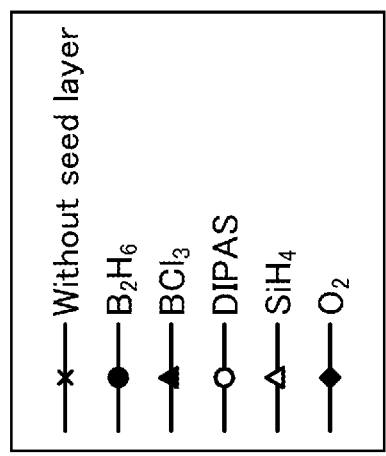
FIG. 7 is a diagram illustrating a relationship between a number of ALD cycles and a film thickness of a molybdenum film.
Figure 7:
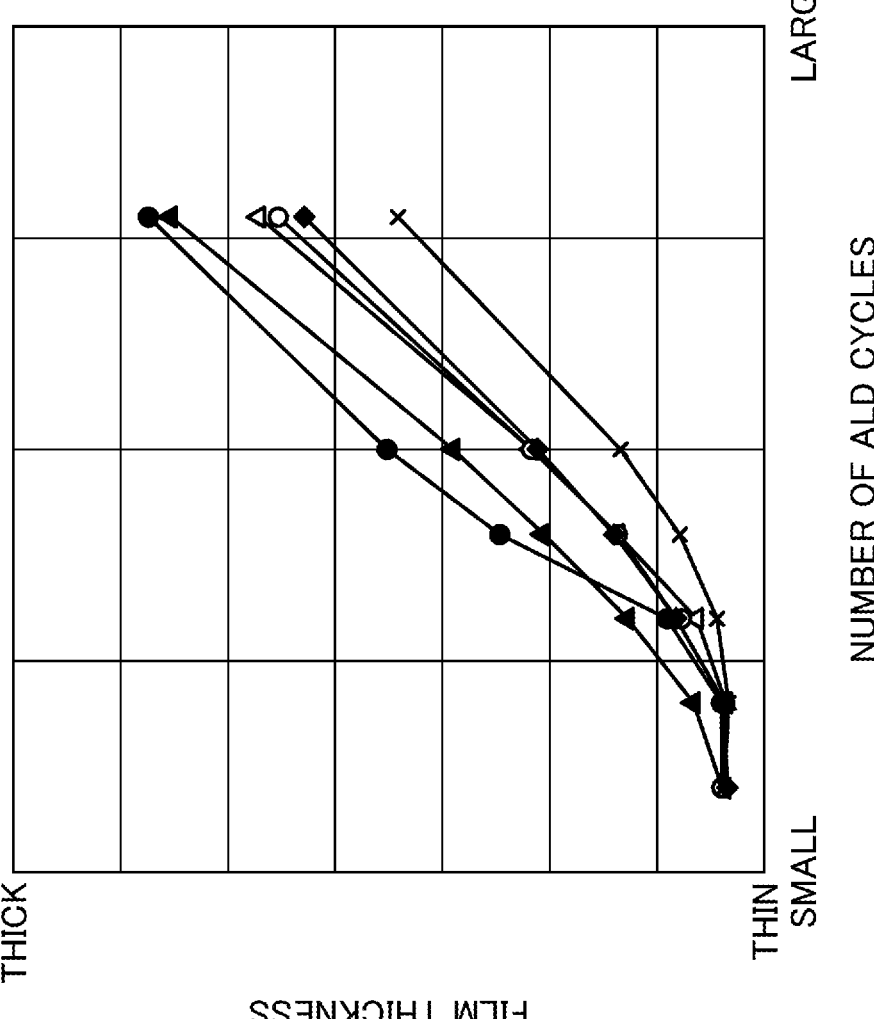

Next, by measuring a film thickness of the molybdenum film that is formed, a relationship is acquired between the number of times the ALD cycle is repeated (hereinafter, also referred to as the "number of ALD cycles") and the film thickness of the molybdenum film. FIG. 7 is a diagram illustrating the relationship between the number of ALD cycles and the film thickness of the molybdenum film. In FIG. 7, the abscissa indicates the number of ALD cycles, and the ordinate indicates the film thickness of the molybdenum film. In FIG. 7, the number of ALD cycles becomes larger toward the right end of the abscissa, and the film thickness of the molybdenum film becomes thicker towards the upper end of the ordinate.

As illustrated in FIG. 7, it can be seen that, by foaming the seed layer before forming the molybdenum film, the formation of the molybdenum film begins after a small number of ALD cycles compared to when the seed layer is not formed before forming the molybdenum film. These results indicate that, by forming the seed layer before forming the molybdenum film, it is possible to shorten the incubation time.

In addition, as illustrated in FIG. 7, by using the $B_2H_6$ gas and the $BCl_3$ gas when forming the seed layer, it can be seen that an initial deposition rate of the molybdenum film is increased. The results indicate that, by using the boron-containing gas when forming the seed layer, it is possible to further shorten the incubation time.

<Resistivity>

Next, results of experiments in which a change in a resistivity is confirmed when the molybdenum film is formed by changing the type of the seed layer, will be described.

First, a substrate having an AlO film formed thereon is prepared. Then, the prepared substrate is exposed to various types of process gases, to foam a seed layer on the AlO film. The various types of process gases include the $SiH_4$ gas, the DIPAS gas, the $B_2H_6$ gas, the $BCl_3$ gas, and the $O_2$ gas. Next, a molybdenum film is formed on the seed layer, by repeating the ALD cycle that includes supplying the $MoO_2Cl_2$ gas, and supplying the $H_2$ gas, to the substrate having the seed layer famed thereon.

In addition, for comparison purposes, the substrate having the AlO film formed thereon is prepared.

Then, without forming the seed layer on the AlO film, the molybdenum film is formed on the AlO film by repeating the AID cycle that includes supplying the $MoO_2Cl_2$ gas, and supplying the $H_2$ gas, to the prepared substrate.

Figure 8:
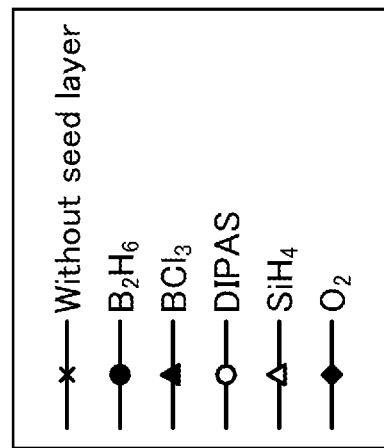
FIG. 8 is a diagram illustrating the measurement results of a resistivity of the molybdenum film.
Figure 8:
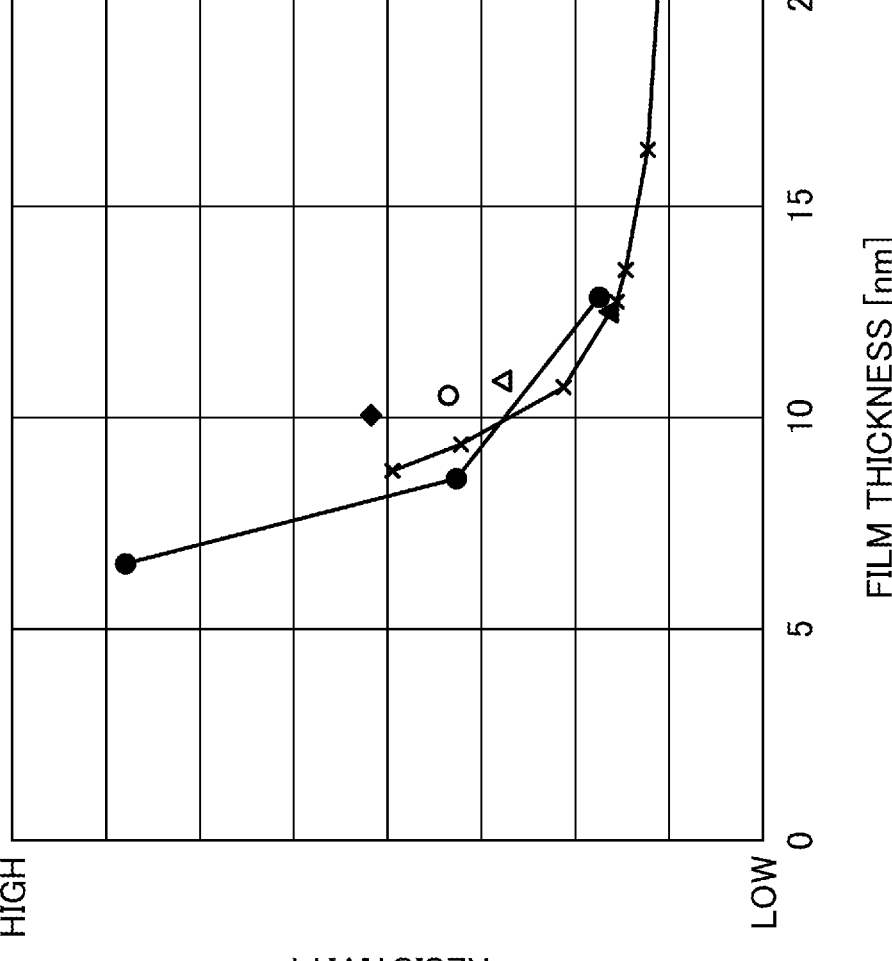

Next, by measuring a film thickness and a resistivity of the molybdenum film that is formed, a relationship is acquired between the film thickness and the resistivity of the molybdenum film. FIG. 8 is a diagram illustrating measurement results of the resistivity of the molybdenum film. In FIG. 8, the abscissa indicates the film thickness [nm] of the molybdenum film thickness, and the ordinate indicates the resistivity of the molybdenum film. In FIG. 8, the resistivity of the molybdenum film becomes higher towards the upper end of the ordinate.

As illustrated in FIG. 8, it can be seen that there is no significant difference between the resistivity for the case where the seed layer is inserted between the AlO film and the molybdenum film, and the resistivity for the case where the seed layer is not inserted between the AlO film and the molybdenum film. The results indicate that the resistivity does not deteriorate even in the case where the seed layer is inserted between the AlO film and the molybdenum film.

According to the embodiments described above, a molybdenum film can be formed on the underlayer while preventing damage to the underlayer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosures.

In the embodiment described above, the deposition apparatus is the batch-type apparatus that processes a plurality of substrates simultaneously, but the present disclosure is not limited to the batch-type apparatus. For example, the deposition apparatus may be a single substrate processing apparatus that processes one substrate at a time. In addition, the deposition apparatus may be a semi-batch type apparatus in which a plurality of substrates disposed on a turntable inside the processing chamber are caused to revolve by the turntable, and processes are performed with respect to the substrate by sequentially passing through a region supplied with a first gas and a region supplied with a second gas. Moreover, the deposition apparatus may be a multiple substrate deposition apparatus having a plurality of supports configured to support the substrates, respectively, inside a single processing chamber.

What is claimed is:

1. A deposition method comprising:
    preparing a substrate having an insulating film formed thereon;
    forming a seed layer on the insulating film by exposing the substrate solely to a single process gas and causing the single process gas to be adsorbed on the insulating film; and
    supplying a molybdenum-containing gas and a reducing gas to the substrate having the seed layer formed thereon, to form a molybdenum film on the seed layer.

2. The deposition method as claimed in claim 1, wherein the single process gas includes at least one of a silicon-containing gas, a boron-containing gas, and an oxygen-containing gas.

3. The deposition method as claimed in claim 1, wherein the single process gas is a silicon-containing gas including at least one of a silicon hydride gas, a halogen-containing silicon gas, and an aminosilane-based gas.

4. The deposition method as claimed in claim 1, wherein the single process gas is a boron-containing gas including at least one of a $B_2H_6$ gas and a $BCl_3$ gas.

5. The deposition method as claimed in claim 1, wherein the single process gas is an oxygen-containing gas including at least one of an $O_2$ gas, an $O_3$ gas, and a $H_2O$ gas.

6. The deposition method as claimed in claim 1, wherein the insulating film is formed by a block oxide film.

7. The deposition method as claimed in claim 1, wherein the molybdenum-containing gas is a $MoO_2Cl_2$ gas.

8. The deposition method as claimed in claim 1, wherein the reducing gas is a $H_2$ gas.

9. A deposition method comprising:

preparing a substrate having an insulating film formed thereon;

forming a seed layer on the insulating film by exposing the substrate solely to one process gas composition and causing the one process gas composition to be adsorbed on the insulating film; and supplying a molybdenum-containing gas and a reducing gas to the substrate having the seed layer formed thereon, to form a molybdenum film on the seed layer.

10. The deposition method as claimed in claim 9, wherein the one process gas composition includes at least one of a silicon-containing gas, a boron-containing gas, and an oxygen-containing gas.

11. The deposition method as claimed in claim 9, wherein the one process gas composition is a silicon-containing gas composition including at least one of a silicon hydride gas, a halogen-containing silicon gas, and an aminosilane-based gas.

\* \* \* \* \*